United States Patent [19]

Vaes et al.

[11] Patent Number: 5,456,999
[45] Date of Patent: Oct. 10, 1995

[54] INFRARED SENSITIVE SILVER HALIDE PHOTOGRAPHIC MATERIAL

[75] Inventors: Jos Vaes, Betekom; Luc Wabbes, Mortsel, both of Belgium

[73] Assignee: AGFA-Gevaert, N.V., Mortsel, Belgium

[21] Appl. No.: 978,085

[22] Filed: Nov. 17, 1992

[30] Foreign Application Priority Data

Nov. 29, 1991 [EP] European Pat. Off. ............. 91203124

[51] Int. Cl.$^6$ ..................................................... G03C 8/02
[52] U.S. Cl. ............... 430/204; 430/229; 430/230; 430/508; 430/572; 430/574; 430/584; 430/588; 430/592; 430/944
[58] Field of Search ..................... 430/572, 574, 430/577, 584, 588, 592, 944, 204, 229, 230, 508

[56] References Cited

U.S. PATENT DOCUMENTS

| | | | |
|---|---|---|---|
| 2,688,545 | 9/1954 | Carroll et al. | 430/574 |
| 3,565,630 | 2/1971 | Millikan et al. | 430/577 |
| 3,628,964 | 12/1971 | Shiba et al. | 430/574 |
| 3,694,217 | 9/1972 | Sakaguchi et al. | 430/574 |
| 4,121,935 | 10/1978 | Nishina et al. | |
| 4,801,525 | 1/1989 | Mihara et al. | 430/944 |
| 4,908,303 | 3/1990 | Miyasaka et al. | 430/572 |
| 4,910,129 | 3/1990 | Takahashi et al. | 430/584 |
| 5,202,218 | 4/1993 | Yoshida et al. | 430/204 |

Primary Examiner—Janet C. Baxter
Attorney, Agent, or Firm—Breiner & Breiner

[57] ABSTRACT

The present invention provides a photographic material comprising a silver halide emulsion layer sensitized to light above 700 nm by means of an infrared sensitizing dye having a maximum absorption between 700 nm and 850 nm characterized in that said silver halide emulsion further comprises a red sensitizing dye of the cationic type having a maximum absorption between 600 nm and 700 nm. The thus obtained photographic material shows an increased sensitivity in the infrared region. The material can be used in as silver salt diffusion transfer process to prepare a lithographic printing plate.

7 Claims, No Drawings

INFRARED SENSITIVE SILVER HALIDE PHOTOGRAPHIC MATERIAL

FIELD OF THE INVENTION

The present invention relates to a silver halide photographic material sensitive to light sources emitting light above 700 nm. The present invention further relates to a method for obtaining images with said photographic material and to a method for obtaining a lithographic printing plate with said photographic material.

BACKGROUND OF THE INVENTION

With recent rapid progress of information transmitting systems, silver halide photographic light sensitive materials have been increasingly required to have high sensitivity. Such systems are, for example, high speed phototypesetting systems according to which information output from an electronic computer is immediately displayed as letters or figures by a cathode ray tube and press facsimile systems for rapid transmission of news paper originals to a remote place.

Photographic phototypesetting materials include photographic films and papers used in a process for preparing a lithographic printing plate and silver salt diffusion transfer based lithographic printing plates disclosed in e.g. U.S. Pat. No. 4.501.811 and U.S. Pat. No. 4.784.933. With the latter materials a lithographic printing plate is immediately obtained without the need of a contact exposure or camera exposure.

Characteristics required for silver halide photographic light sensitive materials for these uses are high sensitivity to so-called high intensity-short time exposure (flash exposure), namely, exposure for $10^{-4}$ second or less with light sources, e.g. laser, cathode ray tube (CRT), helium-neon gas laser and light emission diode (LED), high contrast and high resolving power.

The method of using laser light sources such a helium-neon and argon as a scanning type light source has the defects that large and expensive devices are necessary and efficiency of consumed power is low. On the other hand, a semiconductor laser has the advantages that it is small in size, inexpensive, easily modulatable and long in life. For semiconductor laser, there are used semiconductors of such systems as Ga/As/P; Ga/Al As; Ga/As; In/As and the like and the wavelength of these laser beams is generally longer than 700 nm and largely longer than 750 nm.

Therefore, bright safelight can be used and thus handleability is good. However, light sensitive materials for infrared rays are generally not so high in sensitivity and inferior in shelf stability and various proposals have been made in an attempt to solve these problems. For example, a technique called supersensitization effect has been proposed according to which spectral sensitivity is markedly enhanced by adding a specifically selected organic compound in addition to the spectral sensitizing dye. Reference may be made to, for example, triazine derivatives disclosed in U.S. Pat. Nos. 2,785,058 and 3,695,888, mercapto compounds having electronegative group disclosed i n U.S. Pat. No. 3,457,078. However, many of these supersensitization techniques provide unsatisfactory results such as insufficient sensitization, increase of fog and decrease in shelf stability.

SUMMARY OF THE INVENTION

It is an object of the present invention to provide a photographic material comprising a silver halide emulsion spectrally sensitized to wave lenghts above 700 nm having a high sensitivity.

It is an object of the present invention to provide a method for obtaining images using a photographic material comprising a silver halide emulsion spectrally sensitized to wavelenghts above 700 nm having a high sensitivity.

It is an object of the present invention to provide a method for obtaining a lithographic printing plate according to the silver salt diffusion transfer process using a photographic material comprising a silver halide emulsion spectrally sensitized to wavelenghts above 700 nm having a high speed.

Further objects of the present invention will become clear from the description hereinafter.

According to the present invention there is provided a photographic material comprising a silver halide emulsion layer sensitized to light above 700 nm by means of an infrared sensitizing dye having a maximum absorption between 700 nm and 850 nm characterized in that said silver halide emulsion further comprises a red sensitizing dye of the cationic type having a maximum absorption between 600 nm and 700 nm.

According to the present invention a method is provided for obtaining images using the above defined photographic material.

According to the present invention a method is provided for obtaining a lithographic printing plate according to the silver salt diffusion transfer process using a photographic material as defined above.

DETAILED DESCRIPTION

It has been found that the sensitivity of a photographic material comprising a silver halide emulsion layer sensitized to light above 700 nm by means of an infrared sensitizing dye having a maximum absorption between 700 nm and 850 nm can be increased by adding a red sensitizing dye of the cationic type having a maximum absorption between 600 nm and 700 nm.

By the maximum absorption of the red and infrared dye is meant the maximum absorption of the separate dye determined in a silver halide emulsion.

The increase in sensitivity of the photographic material in the infrared region is only obtained when a red sensitizing dye of the cationic type is used. Thus the effect is not obtained or is much smaller when a red sensitizing dye of the zwitter ionic or anionic type is used. Such is surprisingly and it is not understood why the effect is only obtained with dyes of the cationic type. It may be that this is due to the generaly lower solubility of the cationic red sensitizing dyes in aqueous medium.

Red sensitizing dyes of the cationic type suitable for use in accordance with the present invention are the cationic red sensitizing dyes commonly employed e.g. the cationic dyes described by F. M. Hamer in "The Cyanine Dyes and Related Compounds", 1964, John Wiley & Sons. Preferred red sensitizing dyes correspond to one of the following formulas (I) or (II):

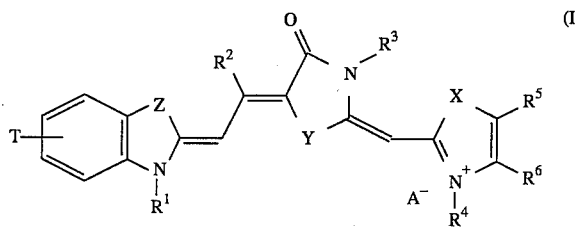

(I)

wherein each of X and Z independently represents S or Se, Y represents S or NR with R representing an alkyl, cycloalkyl or aryl group each of which may be substituted, each of $R^1$ and $R^4$ independently represents $C_1$–$C_4$ alkyl, $R^2$ and $R^3$ each independently represents hydrogen, an alkyl, aralkyl or aryl group each of which may be substituted, $R^5$ and $R^6$ each independently represents an alkyl, aryl, aralkyl group each of which may be substituted and $R^5$ and $R^6$ may also be linked to each other to form a ring that may contain one or more heteroatoms and that may be aromatic, T represents hydrogen or one or more substituents selected from the group of alkyl, aryl, aralkyl, halogen, —CN, ester, hydroxyl, —$NH_2$, —NHR, $NR_2$ with R as defined above, fused-on rings and alkoxy and $A^-$ represents an anion, e.g. $F^-$, $Cl^-$, $Br^-$, $I^-$, toluene sulphonate, $ClO_4^-$ etc..

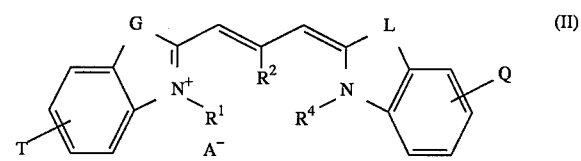

(II)

wherein $R^1$, $R^2$, $R^4$, $A^-$ and T each have the same meaning as defined above, each of G and L independently represents S, Se or $C(CH_3)_2$ and Q independently from T may have one of the significances given for T. Examples of formula (I) and (II) are listed in table 1.

TABLE 1

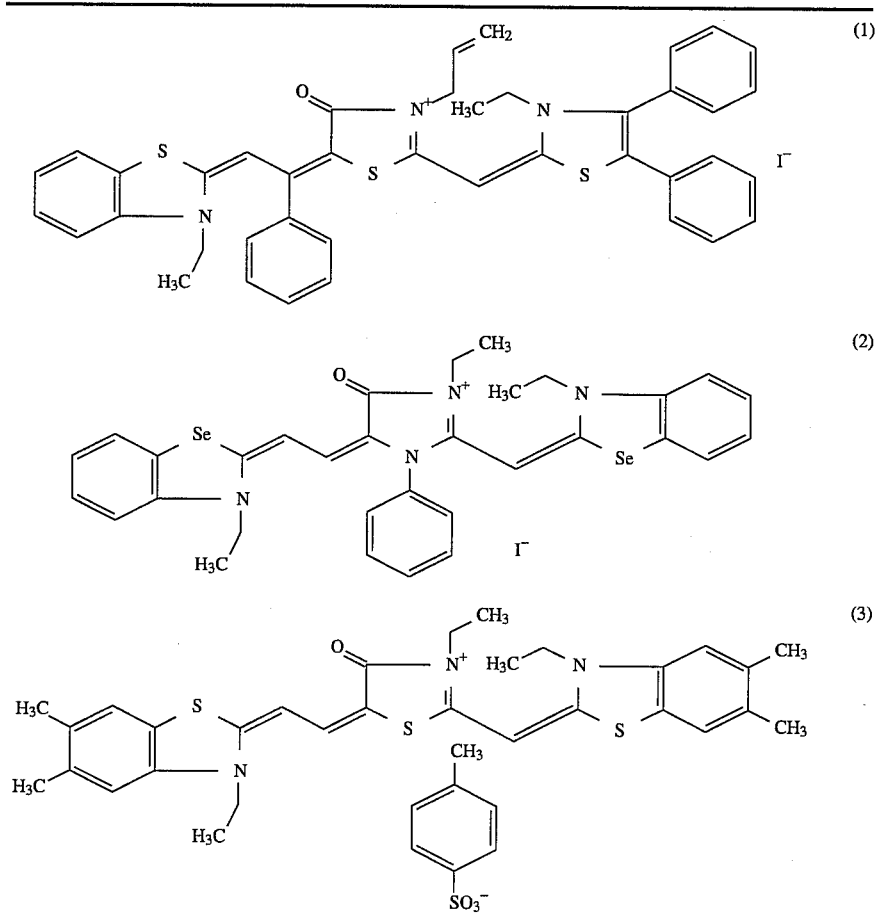

TABLE 1-continued
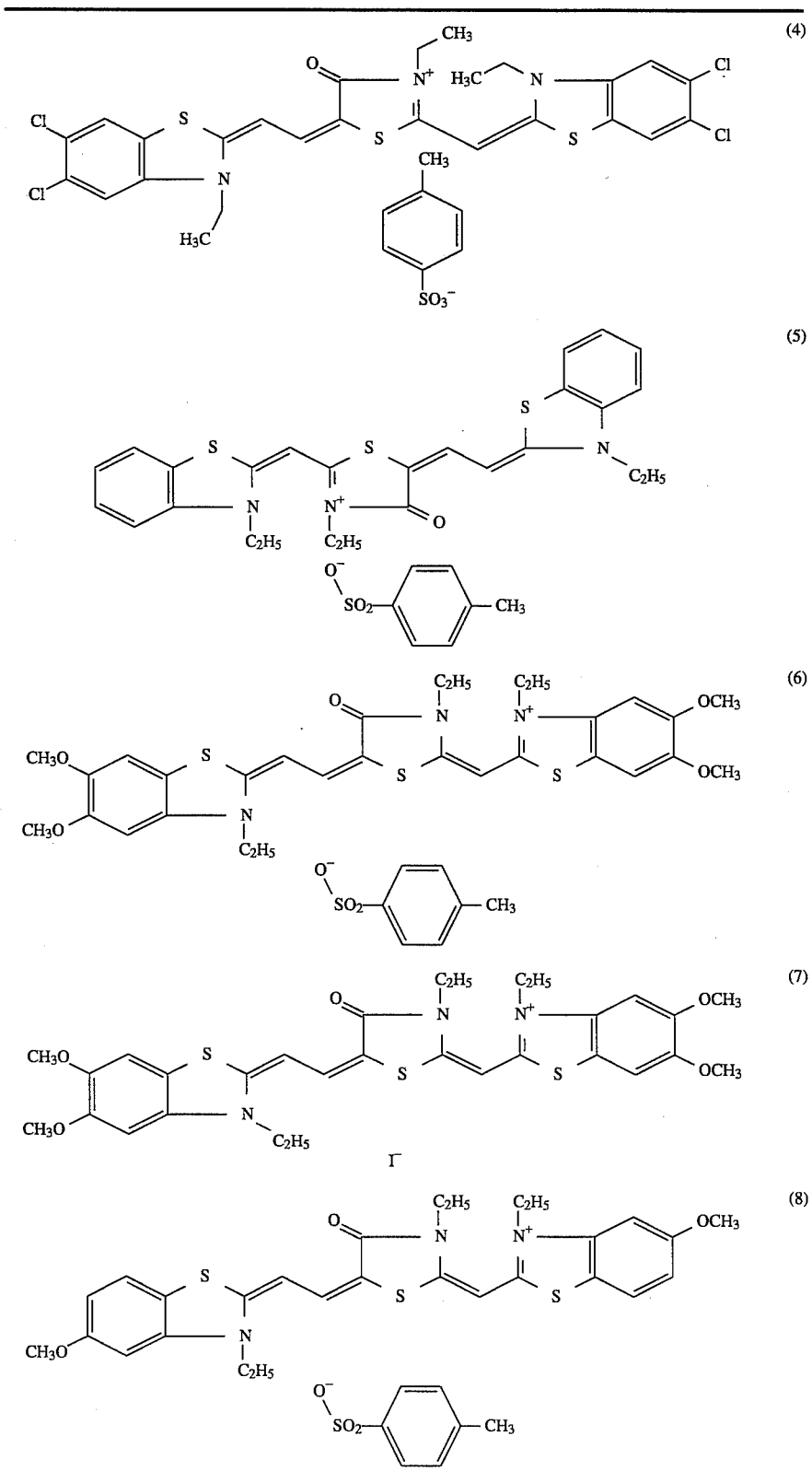

TABLE 1-continued
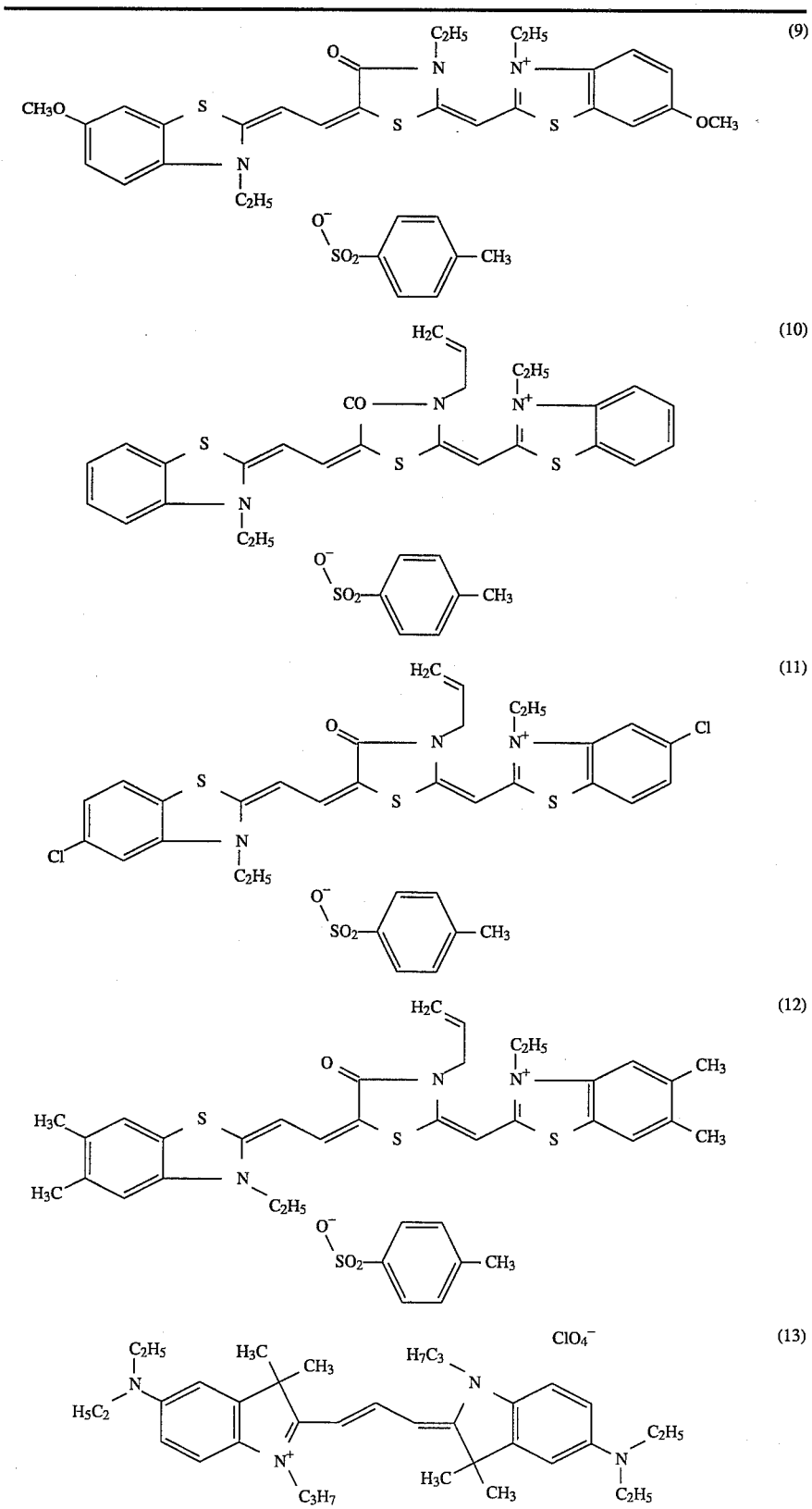

TABLE 1-continued

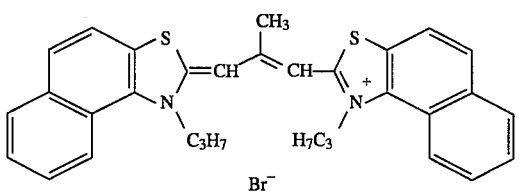 (14)

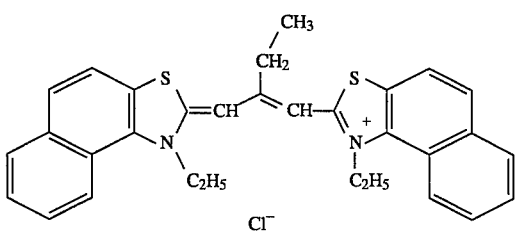 (15)

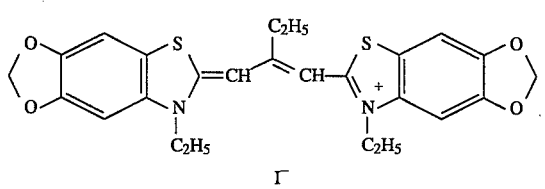 (16)

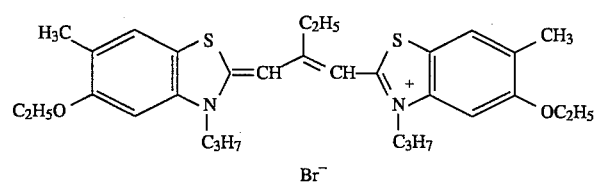 (17)

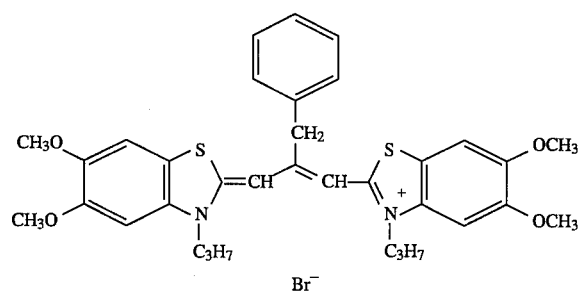 (18)

The red sensitizing dye is preferably added to the silver halide emulsion in an amount of $1*10^{-5}$ mol/mol of silver halide to $1*10^{-4}$ mol/mol of silver halide. When amounts less than $1*10^{-5}$ mol/mol of silver halide are used the desired sensitivity in the red and/or far red part of the spectrum i.e. from 600 to 700 may not be obtained while amounts larger than $1*10^{-4}$ mol/mol of silver halide may yield silver halide emulsion of low stability due to fogging. The optimal amount of red sensitizing dye to be used in accordance with the present invention depends on the silver halide composition, average grain size and crystal habit of the silver halide grain, type of sensitizing dyes etc.

Suitable infra-red sensitizing dyes for use in accordance with the present invention are disclosed in i.a. U.S. Pat. Nos. 2,095,854, 2,095,856, 2,955,939, 3,482,978, 3,552,974, 3,573,921, 3,582,344, 3,623,881 and 3,695,888. Preferred infra-red sensitizing dyes correspond to general formula (III) or (IV):

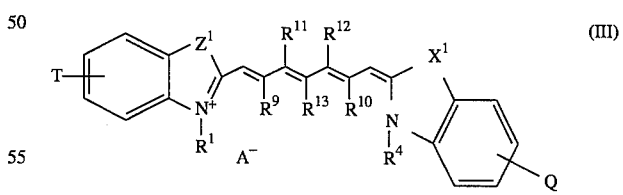 (III)

wherein T, Q, $R^1$, $R^4$, and $A^-$ each have the same meaning as defined above, $Z^1$ and $X^1$ each independently represents O, S or Se, $R^9$, $R^{10}$ and $R^{13}$ each independently represents an alkyl, aryl, aralkyl or a cycloalkyl group each of which may contain one or more hetero-atoms and that may be substituted, a halogen or hydrogen and $R^9$ or $R^{10}$ may be linked to $R^{13}$ to form a ring and $R^{11}$ and $R^{12}$ each independently represents hydrogen or an alkyl group and that may be linked to each other to form a ring.
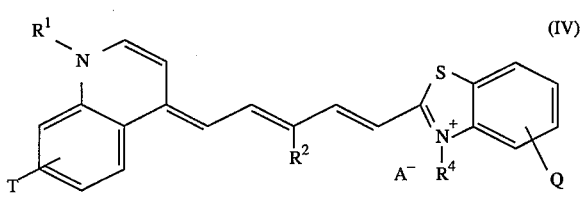
wherein $R^1$, $R^2$, $R^4$, T, Q and $A^-$ have the same meaning as defined above
Examples of dyes corresponding to formula (III) and (IV) are listed in table 2.
TABLE 2
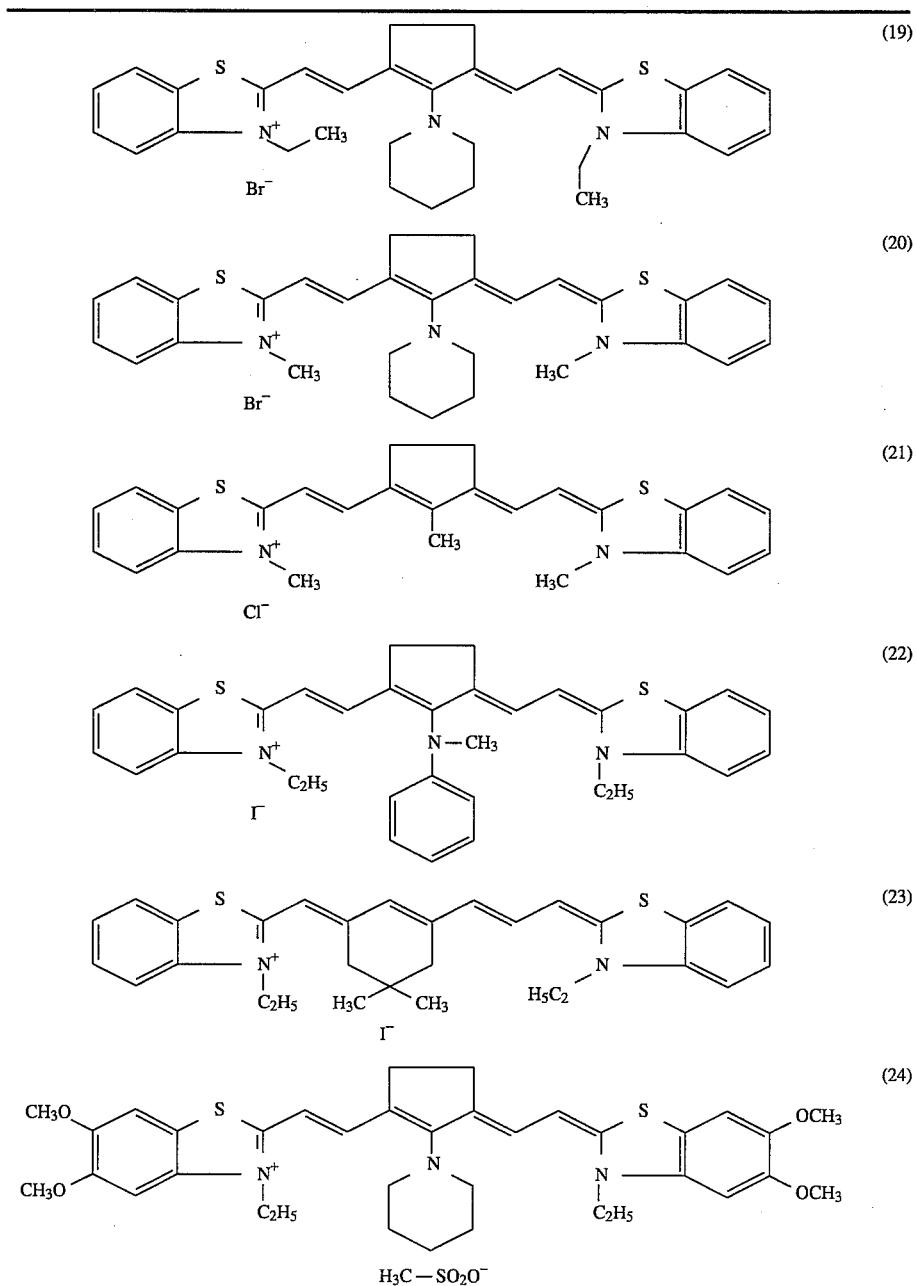

TABLE 2-continued

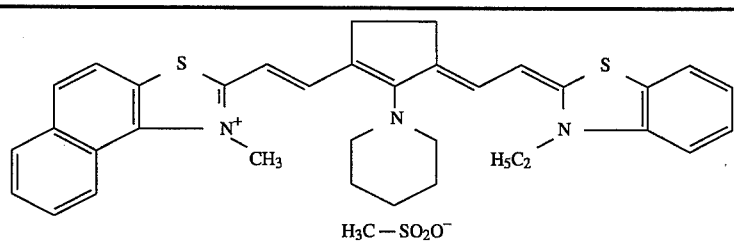

(25)

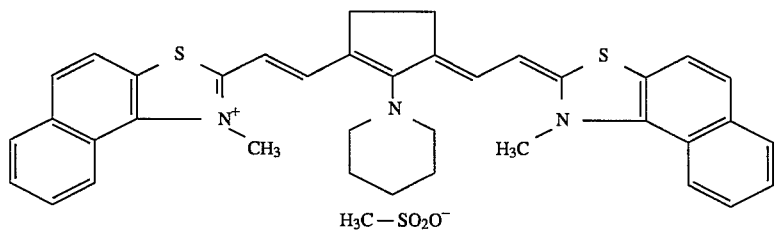

(26)

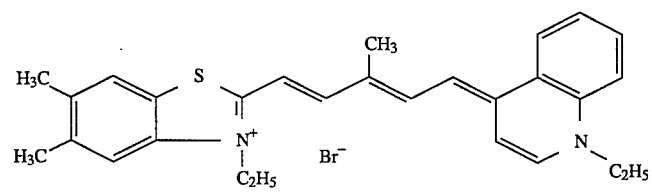

(27)

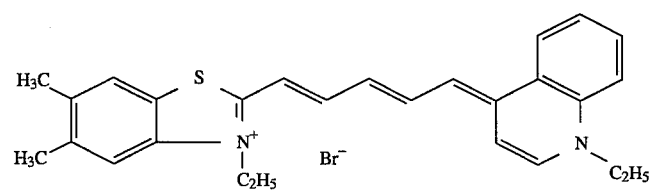

(28)

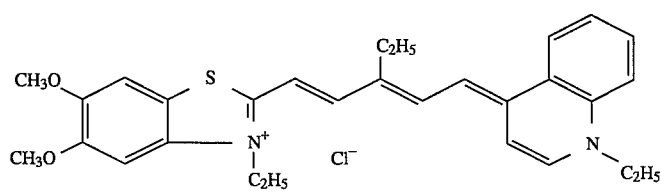

(29)

The infrared sensitizing dye is preferably added to the silver halide emulsion in an amount of $1*10^{-6}$ mol/mol of silver halide to $3*10^{-5}$ mol/mol of silver halide. When amounts less than $1*10^{-6}$ mol/mol of silver halide are used the desired sensitivity in the infrared part of the spectrum i.e. above 700 nm may not be obtained while amounts larger than $3*10^{-5}$ mol/mol of silver halide may yield silver halide emulsion of low stability due to fogging. The optimal amount of infrared sensitizing dye to be used in accordance with the present invention depends on the silver halide composition, average grain size and crystal habit of the silver halide grain, type of sensitizing dyes etc.

The silver halide emulsion according to the present invention may further comprise a so-called supersensitizing compound i.e. a compound that shows no substantial absorption in the sensitivity range of the dye mixture used in accordance with the present invention and whereby said supersensitizing compound increases the sensitivity in the infrared region. Suitable supersensitizing compounds for use in accordance with the present invention are disclosed in e.g. Research Disclosure Vol 289, May 1988, item 8952, U.S. Pat. Nos. 5.009.991, 4.910.129, 2.785.058, 3.695.888; 3.457.078 etc. Said supersensitizing compound or compounds are preferably used in a total amount of $5*10^{-5}$ mol/mol silver halide to $5*10^{-4}$ mol/mol of silver halide. Too small amounts of supersensitizing compound may yield silver halide emulsion of low sensitivity and low stability while too large amounts of supersensitizing compound(s) may also yield low sensitivity due to a reduced development rate of the silver halide. Preferably used supersensitizing compounds are of the 1-phenyl-5-mercaptotetrazole type or of the 2-mercaptobenzthiazole type. Specific examples of supersensitizing compounds are:

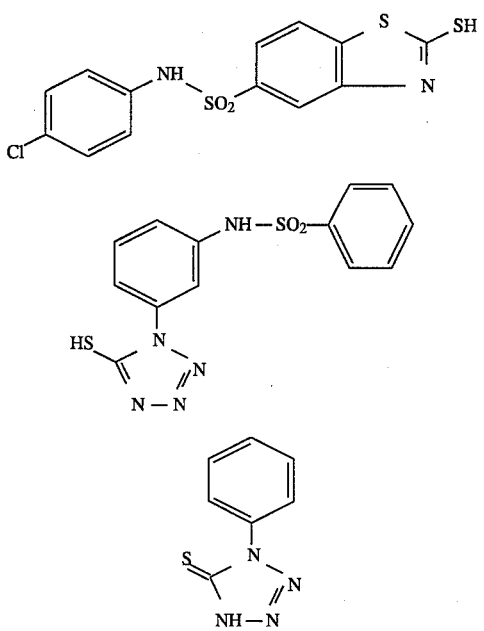

Spectral sensitization of the silver halide emulsion is preferably carried out as a last step in the preparation of the silver halide emulsion. The red sensitizing dye, infrared sensitizing and supersensitizing compound may be sequentially added in any order or simultaneously to the silver halide emulsion during sensitization. However the supersensitizer is preferably added first followed by the red sensitizing dye.

The photographic silver halide emulsions can be prepared from soluble silver salts and soluble halides according to different methods as described e.g. by P. Glafkides in "Chimie et Physique Photographique", Paul Montel, Paris (1967), by G. F. Duffin in "Photographic Emulsion Chemistry", The Focal Press, London (1966), and by V. L. Zelikman et al in "Making and Coating Photographic Emulsion", The Focal Press, London (1966).

The photographic silver halide emulsions used according to the present invention can be prepared by mixing the halide and silver solutions in partially or fully controlled conditions of temperature, concentrations, sequence of addition, and rates of addition. The silver halide can be precipitated according to the single-jet method or the double-jet method.

The silver halide particles of the photographic emulsions used according to the present invention may have a regular crystalline form such as a cubic or octahedral form or they may have a transition form. They may also have an irregular crystalline form such as a spherical form or a tabular form, or may otherwise have a composite crystal form comprising a mixture of said regular and irregular crystalline forms.

To take most advantage of the present invention the emulsion or emulsions preferably consist principally of silver chloride preferably at least 70 mole % while a fraction of silver bromide may be present ranging from 1 mole % to 30 mole %. When silver chlorobromide emulsions are used they preferably belong to the core/shell type well known to those skilled in the art in the sense that substantially all the bromide is concentrated in the core. This core contains preferably 10 to 40% of the total silver halide precipitated, while the shell consists preferably of 60 to 90% of the total silver halide precipitated. The silver halide may also contain small amounts of iodide i.e. upto 3%.

The average size of the silver halide grains may range from 0.10 to 0.70 μm, preferably from 0.25 to 0.45 μm.

The size distribution of the silver halide particles of the photographic emulsions to be used according to the present invention can be homodisperse or heterodisperse. A homodisperse size distribution is obtained when 95% of the grains have a size that does not deviate more than 30% from the average grain size.

Preferably during the precipitation stage Iridium and/or Rhodium containing compounds or a mixture of both are added. The concentration of these added compounds ranges from $10^{-8}$ to $10^{-3}$ mole per mole of $AgNO_3$, preferably between $10^{-7}$ and $10^{-6}$ mole per mole of $AgNO_3$. This results in the building in in the silver halide crystal lattice of minor amounts of Iridium and/or Rhodium, so-called Iridium and/or Rhodium dopants. As known to those skilled in the art numerous scientific and patent publications disclose the addition of Iridium or Rhodium containing compounds or compounds containing other elements of Group VIII of the Periodic System during emulsion preparation.

The emulsions can be chemically sensitized e.g. by adding sulphur-containing compounds during the chemical ripening stage e.g. allyl isothiocyanate, allyl thiourea, and sodium thiosulphate. Also reducing agents e.g. the tin compounds described in BE-P 493,464 and 568,687, and polyamines such as diethylene triamine or derivatives of aminomethane-sulphonic acid can be used as chemical sensitizers. Other suitable chemical sensitizers are noble metals and noble metal compounds such as gold, platinum, palladium, iridium, ruthenium and rhodium. This method of chemical sensitization has been described in the article of R. KOSLOWSKY, Z. Wiss. Photogr. Photophys. Photochem. 46, 65–72 (1951).

The silver halide emulsions may contain the usual stabilizers e.g. homopolar or salt-like compounds of mercury with aromatic or heterocyclic rings such as mercaptotriazoles, simple mercury salts, sulphonium mercury double salts and other mercury compounds. Other suitable stabilizers are azaindenes, preferably tetra- or penta-azaindenes, especially those substituted with hydroxy or amino groups. Compounds of this kind have been described by BIRR in Z. Wiss. Photogr. Photophys. Photochem. 47, 2–27 (1952). Other suitable stabilizers are i.a. heterocyclic mercapto compounds e.g. phenylmercaptotetrazole, quaternary benzothiazole derivatives, and benzotriazole. Preferred compounds are mercapto substituted pyrimidine derivatives as disclosed in U.S. Pat. No. 3,692,527.

The silver halide emulsions may contain pH controlling ingredients. Preferably the emulsion layer is coated at a pH value below the isoelectric point of the gelatin to improve the stability characteristics of the coated layer. Other ingredients such as antifogging agents, development accelerators, wetting agents, and hardening agents for gelatin may be present. The silver halide emulsion layer may comprise light-screening dyes that absorb scattering light and thus promote the image sharpness. Suitable light-absorbing dyes are described in i.a. U.S. Pat. Nos. 4,092,168, 4,311,787, and U.S. Pat No. DES 2,453,217.

In an especially preferred embodiment the emulsion layer contained in the imaging element contains a compound which comprises in its molecular structure a group capable of adsorbing to silver halide and a group capable of reducing silver halide. Compounds of this kind have been disclosed in the European Patent Application, filed on 26.02.90 under application No 90.200458.9. In this way a combination of a stabilizing and a development activating function in one compound is achieved. A preferred compound belonging to this class is represented by the following formula:

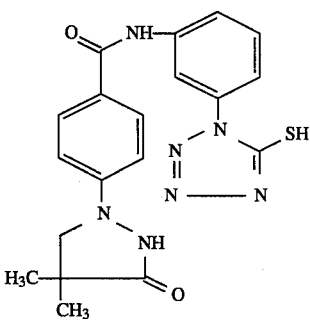

(33)

More details about the composition, preparation and coating of silver halide emulsions can be found in e.g. Product Licensing Index, Vol. 92, Dec. 1971, publication 9232, p. 107–109.

In addition to the above described emulsion layer other hydrophilic colloid layers in water permeable relationship with these layers may be present. For example it is especially advantageous to include a base-layer between the support and the photosensitive silver halide emulsion layer. In a preferred embodiment of the present invention said base-layer serves as an antihalation layer. This layer can therefore contain the same light-absorbing dyes as described above for the emulsion layer; as alternative finely divided carbon black can be used for the same antihalation purposes as described in U.S. Pat. No. 2,327,828. On the other hand, in order to gain sensitivity, light reflecting pigments, e.g. titaniumdioxide can be present. Further this layer can contain hardening agents, matting agents, e.g. silica particles, and wetting agents. At least part of these matting agents and/or light reflection pigments may also be present in the silver halide emulsion layer the most part however preferably being present in said base-layer. As a further alternative the light reflecting pigments may be present in a separate layer provided between the antihalation layer and the photosensitive silver halide emulsion layer.

In a preferred embodiment in connection with the present invention a backing layer is provided at the non-light sensitive side of the support. This layer which can serve as anti-curl layer can contain i.a. matting agents e.g. silica particles, lubricants, antistatic agents, light absorbing dyes, opacifying agents, e.g. titanium oxide and the usual ingredients like hardeners and wetting agents. The backing layer can consist of one single layer or a double layer pack.

The hydrophilic layers usually contain gelatin as hydrophilic colloid binder. Mixtures of different gelatins with different viscosities can be used to adjust the rheological properties of the layer. Like the emulsion layer the other hydrophilic layers are coated preferably at a pH value below the isoelectric point of the gelatin. But instead of or together with gelatin, use can be made of one or more other natural and/or synthetic hydrophilic colloids, e.g. albumin, casein, zein, polyvinyl alcohol, alginic acids or salts thereof, cellulose derivatives such as carboxymethyl cellulose, modified gelatin, e.g. phthaloyl gelatin etc.

The hydrophilic layers of the photographic element, especially when the binder used is gelatin, can be hardened with appropriate hardening agents such as those of the epoxide type, those of the ethylenimine type, those of the vinylsulfone type e.g. 1,3-vinylsulphonyl-2-propanol, chromium salts e.g. chromium acetate and chromium alum, aldehydes e.g. formaldehyde, glyoxalo and glutaraldehyde, N-methylol compounds e.g. dimethylolurea and methyloldimethylhydantoin, dioxan derivatives e.g. 2,3-dihydroxy-dioxan, active vinyl compounds e.g. 1,3,5-triacryloyl-hexahydro-s-triazine, active halogen compounds e.g. 2,4-dichloro-6-hydroxy-s-triazine, and mucohalogenic acids e.g. mucochloric acid and mucophenoxychloric acid. These hardeners can be used alone or in combination. The binders can also be hardened with fast-reacting hardeners such as carbamoylpyridinium salts of the type, described in U.S. Pat. No. 4,063,952.

Preferably used hardening agents are of the aldehyde type. The hardening agents can be used in wide concentration range but are preferably used in an amount of 4% to 7% of the hydrophilic colloid. Different amounts of hardener can be used in the different layers of the imaging element or the hardening of one layer may be adjusted by the diffusion of a hardener from another layer.

The imaging element used according to the present invention may further comprise various kinds of surface-active agents in the photographic emulsion layer or in at least one other hydrophilic colloid layer. Suitable surface-active agents include non-ionic agents such as pluronics, saponins, alkylene oxides e.g. polyethylene glycol, polyethylene glycol/polypropylene glycol condensation products, polyethylene glycol alkyl ethers or polyethylene glycol alkylaryl ethers, polyethylene glycol esters, polyethylene glycol sorbitan esters, polyalkylene glycol alkylamines or alkylamides, silicone-polyethylene oxide adducts, glycidol derivatives, fatty acid esters of polyhydric alcohols and alkyl esters of saccharides; anionic agents comprising an acid group such as a carboxy, sulpho, phospho, sulphuric or phosphoric ester group; ampholytic agents such as aminoacids, aminoalkyl sulphonic acids, aminoalkyl sulphates or phosphates, alkyl betaines, and amine-N-oxides; and cationic agents such as alkylamine salts, aliphatic, aromatic, or heterocyclic quaternary ammonium salts, aliphatic or heterocyclic ring-containing phosphonium or sulphonium salts. Preferably compounds containing perfluorinated alkyl groups are used. Such surface-active agents can be used for various purposes e.g. as coating aids, as compounds preventing electric charges, as compounds improving slidability, as compounds facilitating dispersive emulsification and as compounds preventing or reducing adhesion.

The photographic material of the present invention may further comprise various other additives such as e.g. compounds improving the dimensional stability of the photographic element, UV-absorbers, spacing agents and plasticizers.

Suitable additives for improving the dimensional stability of the photographic element are e.g. dispersions of a water-soluble or hardly soluble synthetic polymer e.g. polymers of alkyl (meth)acrylates, alkoxy(meth)acrylates, glycidyl (meth)acrylates, (meth)acrylamides, vinyl esters, acrylonitriles, olefins, and styrenes, or copolymers of the above with acrylic acids, methacrylic acids, Alpha-Beta-unsaturated dicarboxylic acids, hydroxyalkyl (meth)acrylates, sulphoalkyl (meth)acrylates, and styrene sulphonic acids.

Supports suitable for use in accordance with the present invention may be opaque or transparent, e.g. a paper support or resin support. When a paper support is used preference is given to one coated at one or both sides with an Alpha-olefin polymer, e.g. a polyethylene layer which optionally contains an antihalation dye or pigment. It is also possible to use an organic resin support e.g. cellulose nitrate film, cellulose acetate film, poly(vinyl acetal) film, polystyrene film, poly-(ethylene terephthalate) film, polycarbonate film, polyvinylchloride film or poly-Alpha-olefin films such as polyethylene or polypropylene film. The thickness of such organic resin film is preferably comprised between 0.07 and 0.35 mm. These organic resin supports are preferably coated with a hydrophilic adhesion layer which can contain water insoluble particles such as silica or titanium dioxide. Metal supports such as e.g. aluminium, zinc, steel etc., may also be used in accordance with the photographic element of the present invention.

According to a preferred method of the present invention the above described photographic material element is information-wise exposed using a scanning exposure beam between 700 nm and 850 nm and is subsequently developed in alkaline processing liquid in the presence of developing agents.

Silver halide developing agents for use in accordance with the present invention are preferably of the p-dihydroxybenzene type, e.g. hydroquinone, methylhydroquinone or chlorohydroquinone, preferably in combination with an auxiliary developing agent being a 1-phenyl-3-pyrazolidinone-type developing agent and/or p-monomethylaminophenol. Particularly useful auxiliary developing agents are of the phenidone type e.g. 1-phenyl -3-pyrazolidinone, 1-phenyl -4-monomethyl -3-pyrazolidinone, and 1-phenyl-4,4-dimethyl-3-pyrazolidinone. However other developing agents can be used. Said developing agents may be contained in an alkaline processing liquid but are preferably contained in one or more layers of the imaging element. In the latter case the alkaline processing liquid merely serves as an alkaline activating liquid.

The pH of said activating liquid is preferably between 12 and 14 and may be established by an organic and/or inorganic alkali agent. Examples of suitable alkali agents are e.g. sodium hydroxide, carbonates, secundary and/or tertiary alkanolamines, amines etc. or mixtures thereof.

The alkaline processing liquid preferably also contains a preserving agent having antioxidation activity, e.g. sulphite ions provided e.g. by sodium or potassium sulphite. For example, the aqueous alkaline solution comprises sodium sulphite in an amount ranging from 0.15 to 1.0 mol/l . Further may be present a thickening agent, e.g. hydroxyethylcellulose and carboxymethylcellulose, fog inhibiting agents, e.g. potassium bromide, potassium iodide and a benzotriazole which is known to improve the printing endurance, calcium-sequestering compounds, anti-sludge agents, and hardeners including latent hardeners.

Development acceleration can be accomplished with the aid of various compounds to the alkaline processing liquid and/or one or more layers of the photographic element, preferably polyalkylene derivatives having a molecular weight of at least 400 such as those described in e.g. U.S. Pat. Nos. 3,038,805 4,038,075, 4,292,400, 4,975,354.

The above described development step is preferably followed by a washing step, a fixing step and another washing or stabilizing step. The first washing step may be omitted.

The photographic material of the present invention may also be used in the silver salt diffusion transfer process. The principles of the silver complex diffusion transfer reversal process, hereinafter called DTR-process, have been described e.g. in U.S. Pat. No. 2352014 and the book "Photographic Silver Halide Diffusion Processes" by André Rott and Edith Weyde—The Focal Press—London and New York, (1972).

According to the DTR process, a silver complex salt is image-wise transferred by diffusion from the image-wise exposed silver halide emulsion layer into an image receiving layer, where it is converted to a silver image usually in the presence of physical development nuclei. For this purpose, the image-wise exposed silver halide emulsion layer is developed in the presence of a developing agent and non-developed silver halide is converted by means of a silver halide complexing agent into a soluble silver complex salt while in contact with an image receiving layer.

At the exposed areas of the silver halide emulsion layer the silver halide is developed (chemical development) and thus cannot be dissolved anymore to diffuse to the receiving layer.

At the unexposed areas of the silver halide emulsion layer the silver halide is converted to a soluble silver complex salt and is transferred to the receiving layer, where it forms a silver image usually in the presence of physical development nuclei.

Suitable silver complexing agents also called silver halide solvents for use in accordance with the present invention are e.g. thiosulphate or thiocyanate. Further interesting silver halide complexing agents, are cyclic imides, preferably combined with alkanolamines, as described in U.S. Pat. Nos. 4,297,430 and 4,355,090 and 2-mercaptobenzoic acid derivatives as described in U.S. Pat. No. 4,297,429, preferably combined with alkanolamines or with cyclic imides and alkanolamines. Said silver halide solvent(s) can be present in one or more layers comprised in the imaging element but are preferably comprised in the alkaline processing liquid.

Preferred development nuclei for use in accordance with the present invention are sulphides of heavy metals e.g. sulphides of antimony, bismuth, cadmium, cobalt, lead, nickel, palladium, platinum, silver, and zinc. Especially suitable development nuclei in connection with the present invention are palladium sulphide nuclei. Other suitable development nuclei are salts such as e.g. selenides, polyselenides, polysulphides, mercaptans, and tin (II) halides. Heavy metals, preferably silver, gold, platinum, palladium, and mercury can be used in colloidal form.

A DTR-image bearing material can be used as a planographic printing plate wherein the DTR-silver image areas form the water-repellant ink-receptive areas on a water-receptive ink-repellant background. For example, typical lithographic printing plates are disclosed e.g. in U.S. Pat. Nos. 4,297,429, 4,297,430, 4,501,811 or 5,059,508.

The DTR-image can be formed in the image-receiving layer of a sheet or web material which is a separate element with respect to the photographic silver halide emulsion material (a so-called two-sheet DTR element) or in the image-receiving layer of a so-called single-support-element, also called mono-sheet element, which contains at least one photographic silver halide emulsion layer integral with an image-receiving layer in waterpermeable relationship therewith. It is the latter mono-sheet version which is preferred for the preparation of offset printing plates by the DTR method.

According to a preferred embodiment of the present invention an imaging element is provided that can be imaged according to the DTR-method so that a lithographic printing plate can be obtained. Said imaging element comprises on a support in the order given a silver halide emulsion layer sensitized to infrared using a dye mixture according to the present invention and a physical development nuclei layer. Preferably the imaging element also comprises a base layer between the support and the silver halide emulsion layer as described above. A further intermediate layer between the silver halide emulsion layer and the layer containing physical development nuclei may also be provided.

A matting agent is preferably included in said base layer and optionally in small amounts i.e. from 1 to 20% by weight is the silver halide emulsion layer. When the matting agent is included in the silver halide emulsion layer it is preferable added to the emulsion after spectral sensitization of the silver halide emulsion to avoid adsorption of the sensitizer to the matting agent. Suitable matting agents for use in accordance with the present embodiment are water insoluble inorganic or organic particles having an average diameter between 1 μm and 10 μm most preferably between 4 μm and 8 μm. A preferred matting agent is silica.

The layer containing physical development nuclei is preferably free of hydrophilic binder but may comprise small amounts upto 30% by weight of the total weight of said layer of a hydrophilic colloid e.g. polyvinyl alcohol to improve the hydrophilicity of the surface.

Preferably used supports in connection with the present embodiment are paper supports or resin supports e.g. polyester film supports.

To obtain a lithographic printing plate the above described DTR-imaging element is information-wise exposed using a scanning exposure in the spectrum of 700 nm to 850 nm and is subsequently developed with an alkaline processing liquid in the presence of developing agent(s) and silver halide solvent(s). Said development step is preferably followed by a neutralization of the surface of the imaged element by guiding the element through a neutralization liquid having a pH between 5 and 7. The neutralization liquid preferably contains a buffer e.g. a phosphate buffer, a citrate buffer or mixture thereof. The neutralization solution can further contain bactericides, e.g. phenol, thymol or 5-bromo-5-nitro-1,3-dioxan as described in EP 0,150,517, wetting agents e.g. saponins or pluronics etc. The liquid can also contain substances which influence the hydrophobic / hydrophilic balance of the printing plate obtained after processing of the DTR element, e.g. silica. Finally the neutralization solution can contain wetting agents, preferably compounds containing perfluorinated alkyl groups.

To improve the differentiation between the hydrophobic silver image and the hydrophilic background the alkaline processing liquid and/or neutralization liquid preferably contain one or more hydrophobizing agents, e.g. those described in U.S. Pat. Nos. 3,776,728, and 4,563,410. Preferred compounds are 5-n-heptyl-2-mercapto-1,3,4-oxadiazol and 3-mercapto-4-acetamido-5-n. heptyl -1,2,4-triazole.

According to an alternative embodiment of the present invention a lithographic printing plate can be obtained by means of the DTR-process using an imaging element comprising in the order given a grained and anodized aluminium support, an optional layer of physical development nuclei and a silver halide emulsion layer sensitized to the infrared using a dye mixture according to the present invention. The imaging element of the present embodiment may be imaged using an information-wise exposure as described above followed by a development step in the presence of development agent(s) and silver halide solvent(s) so that a silver image is formed in the physical development nuclei layer or directly on the aluminium support. Subsequently the silver halide emulsion layer and any other optional hydrophilic layers are removed by rinsing the imaged element with water so that the silver image is exposed. Finally the hydrophobic character of the silver image is preferably improved using a finishing liquid comprising hydrophobizing agents as described above.

To facilate the removal of the silver halide emulsion layer it is advantageous to provide a hydrophilic layer between the aluminium support and the silver halide emulsion layer. Preferably used hydrophilic layers for this purpose are layers comprising a hydrophilic non-proteinic film-forming polymers e.g. polyvinyl alcohol, polymer beads e.g. poly-(meth)acrylate beads or mixtures thereof. Such type of layers are disclosed in EP-A-90202900.8 and EP-A-410500.

The present invention is illustrated by the following examples without limiting it thereto. All parts are by weight unless otherwise specified. The spectral sensitizers and supersensitizers used in the following examples are shown in the description above and are referred to by the number mentioned besides their structure.

EXAMPLE 1

A gelatin silver halide emulsion was prepared using the double jet precipitation by slowly mixing whilst stirring an aqueous solution of $AgNO_3$ having a concentration of 2 mole/l, and an aqueous solution having a concentration of 1.7 mole/l of NaCl, 0.48 mole/l of KBr and 0.001 mole/l of KI. Before the precipitation $5*10^{-4}$ mole/l of sodium hexachlororhodaat was added to the silver nitrate solution. In a second part of the precipitation an aqueous solution of $AgNO_3$ having a concentration of 1 mole/l was slowly mixed with a aqueous solution of NaCl at a concentration of 1.3 mole/l.

The temperature during the silver halide formation was 55° C. The obtained core-shell emulsion was cooled, flocculated and washed. Gelatin was added in an amount sufficient to reach a ratio of 2/3 by weight of gelatin to silver halide, expressed as equivalent amount of silver nitrate.

Subsequently a chemical ripening was carried out in a conventional way, known to those skilled in the art, using thiosulphate and gold salts.

The emulsion was sensitised for the infrared spectral region by using $0.22*10^{-5}$ mole per mole of $AgNO_3$ of compound (19) and following the procedure: first compound (30) the supersensitizing compound is added in an amount of $50*10^{-5}$ mole per mole of $AgNO_3$ and then the I.R. sensitizing dye (19). Finally compound (33) mentioned above was added.

A comparitive photographic DTR monosheet material was prepared as follows. One side of a film support is coated with two layers by double layer curtain coating. The layer nearer to the support is the antihalation layer and the other is the emulsion layer. The emulsion was coated at an amount of silver halide corresponding to 1.5 g $AgNO_3/m^2$. This emulsion layer contained 0.1 $g/m^2$ of 1-phenyl-3-pyrazolidinon and 1.0 $g/m^2$ of gelatin.

The antihalation layer contained carbon black, silica particles of 5 micron average size and gelatin at 3 $g/m^2$. The gelatin was lime-treated, substantially free of calcium ions (1000 ppm or less) and of the high viscosity type (not less than 85 m.Pa.s at 40° C. for a 10% solution).

After drying these layers were subjected to a temperature of 40° C. for 5 days and then overcoated with a layer containing PdS nuclei hydrochinon at 0.4 $g/m^2$ and formaldehyde at 100 $mg/m^2$.

3 photographic materials according to the invention were prepared as described above with the exception that during spectral sensitization of the silver halide emulsion after addition of the infrared sensitizing dye a cationic red sensitizing dye was added in an amount of $2.3*10^{-5}$ mole per mole of $AgNO_3$. The type of red sensitizing dye is mentioned in table 3.

A further comparitive photographic material was prepared similar to the samples according to the invention with the exception that the following anionic red sensitizing dye was used instead of the cationic red sensitizing dye.

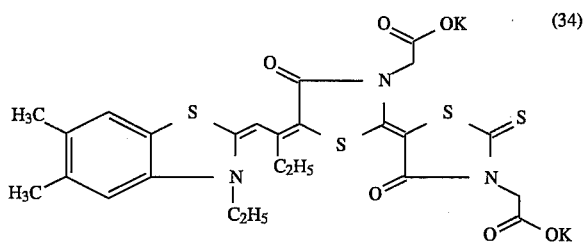

(34)

The following processing solutions were prepared:

| Activator solution | |
|---|---|
| sodium hydroxide | 25 g |
| sodium sulphite anh. | 40 g |
| potassium thiocyanate | 20 g |
| 3-mercapto-4-acetamido-5-n.heptyl-1,2,4-triazole | 0.5 g |
| water to make | 1 l |
| Neutralization solution | |
| citric acid | 10 g |
| sodium citrate | 35 g |
| cysteine | 1 g |
| sodium sulphite anh. | 5 g |
| phenol | 50 mg |
| water to make | 1 l |
| Dampening solution | |
| water | 880 ml |
| citric acid | 6 g |
| boric acid | 8.4 g |
| sodium sulphate anh. | 25 g |
| ethyleneglycol | 100 g |
| colloidal silica | 28 g |

The above described DTR materials were image-wise exposed in image setters working with laser diodes operating between 780 and 800 nm. Subsequently the material was treated with the described activator solution for 10 seconds at 30° C., thereupon treated with the described neutralization solution at 25° C. and finally dried.

The printing plates thus prepared were mounted on an offset printing machine (AB DICK 350 CD-trade name for offset printing machine manufactured by AB DICK Co.). During the printing run the described dampening solution was used in each case.

TABLE 3

| Red dye | relative sensitivity at 780 nm–800 nm* |
|---|---|
| none | reference |
| (1) | −0.20 log It |
| (13) | −0.16 log It |
| (2) | −0.08 log It |
| (34) | +0.20 log It |

*the sensitivity is expressed relative to the comparitive photographic material that does not contain a red dye. A positive number indicates a decrease in sensitivity while a negative number indicates an increase. A value of −0.3 means a doubling of the sensitivity with respect to the reference.

It can be seen from table 3 that the sensitivity of the photographic material in the infrared region is increased by the addition of a cationic red sensitizing dye while there is a decrease when an anionic red sensitizing dye is used. All of the photographic material sin table 3 yielded a printing plate with good printing endurance. The comparitive printing plates showed some staining.

EXAMPLE 2

A comparitive photographic material was prepared similar to the comparitive photographic material of example 1 that does not contain a red sensitizing dye with the exception that the infrared sensitizing dye (19) was replaced by the infrared sensitizing dye (23).

A photographic material according to the invention was prepared similar to the comparative with the exception that the cationic red dye (1) was added to the emulsion in an amount of $2.3*10^{-5}$ mole per mole of $AgNO_3$ after addition of the infrared sensitizing dye.

The sensitivity of the photographic material was increased by −0.14 log It units with respect to the comparitive.

Both photographic materials yielded printing plates with good printing properties. However staining occurred with the comparative sample.

We claim:

1. A photographic material comprising a silver halide emulsion layer comprising a silver halide emulsion sensitized to light above 700 nm by means of an infrared sensitizing dye having a maximum absorption between 700 nm and 850 nm and a layer containing physical development nuclei characterized in that said silver halide emulsion further comprises a red sensitizing dye of the cationic type having a maximum absorption between 600 nm and 700 nm.

2. A photographic material according to claim 1 wherein said silver halide emulsion layer further comprises a supersensitizing compound.

3. A photographic material according to claim 2 wherein said supersensitizing compound is a 1-phenyl-5-mercaptotetrazole or a 2-mercaptobenzthiazole derivative.

4. A photographic material according to claim 1 wherein said silver halide emulsion comprises at least 70mole % of AgCl.

5. A photographic material according to claim 1 wherein said cationic red sensitizing dye corresponds to one of the following two formulas:

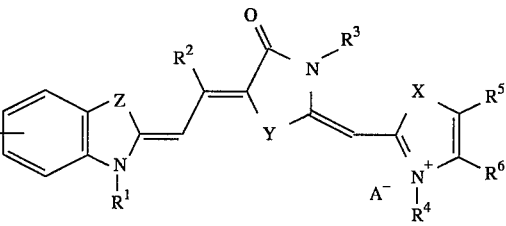

wherein each of X and Z independently represents S or Se, Y represents S or NR with R representing an alkyl, cycloalkyl or aryl group each of which group may be substituted, each of $R^1$ and $R^4$ independently represents $C_1$–$C_4$ alkyl, $R^2$ and $R^3$ each independently represents hydrogen or an alkyl, aralkyl or aryl group each of which group may be substituted, $R^5$ and $R^6$ each independently represents an alkyl, aryl or aralkyl group each of which group may be substituted or $R^5$ and $R^6$ may also be linked to each other to form a ring that may contain one or more heteroatoms and that may be aromatic, n represents an integer from 1 to 4, T represents hydrogen, a substituent selected from the group consisting of alkyl, aryl, aralkyl, halogen, —CN, ester, hydroxyl, —$NH_2$,—NHR', —$NH'_2$ and alkoxy or when n is 2 or more T may represent the necessary atoms to complete one or more fused-on rings, R' represents an alkyl, cycloalkyl or aryl group each of which group may be substituted, and $A^-$ represents an anion;

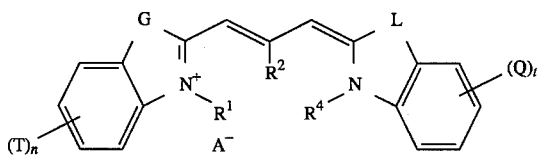

wherein $R^1$, $R^2$, $R^4$, $A^-$, n and T have the same meaning as defined above, each of G and L independently represents S, Se or $C(CH_3)_2$, t represents an integer from 1 to 4, Q represents hydrogen, a substituent selected from the group consisting of alkyl, aryl, aralkyl, halogen, —CN, ester, hydroxyl, —$NH_2$, —NHR", —$NR"_2$ and alkoxy or when t is 2 or more Q may represent the necessary atoms to complete one or more fused-on rings and R" represents an alkyl, cycloalkyl or aryl group each of which group may be substituted.

6. A photographic material according to claim 1 wherein said infrared sensitizing dye corresponds to one of the following formulas:

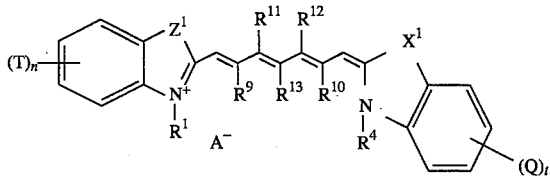

wherein n represents an integer from 1 to 4, T represents hydrogen, a substituent selected from the group consisting of alkyl, aryl, aralkyl, halogen, —CN, ester, hydroxyl, —$NH_2$, —NHR', $NR'_2$ and alkoxy or when n is 2 or more T may represent the necessary atoms to complete one or more fused-on rings, R' represents an alkyl, cycloalkyl or aryl group each of which group may be substituted, t represents an integer from 1 to 4, Q represents hydrogen, a substituent selected from the group consisting of alkyl, aryl, aralkyl, halogen, —CN, ester, hydroxyl, —$NH_2$, —NHR", $NR"_2$ and alkoxy or when t is 2 or more Q may represent the necessary atoms to complete one or more fused-on rings, R" represents an alkyl, cycloalkyl or aryl group each of which group may be substituted, each of $R^1$ and $R^4$ independently represents $C_1$–$C_4$ alkyl, $A^-$ represents an anion, $Z^1$ and $X^1$ each independently represents O, S or Se, $R^9$, $R^{10}$ and $R^{13}$ each independently represents a hydrogen or halogen or an alkyl, aryl, aralkyl or a cycloalkyl group each of which group may be substituted or $R^9$ or $R^{10}$ may be linked to $R^{13}$ to form a ring and $R^{11}$ and $R^{12}$ each independently represents hydrogen or an alkyl group or $R^{11}$ and $R^{12}$ may be linked to each other to form a ring;

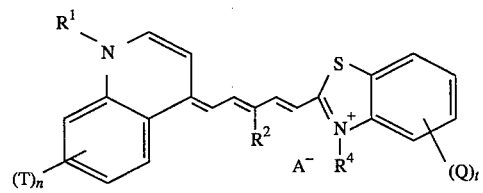

wherein $R^1$, $R^4$, n, T, t, Q and $A^-$ each have the same meaning as defined above and $R^2$ represents hydrogen or an alkyl, aralkyl or aryl group each of which group may be substituted.

7. A method for obtaining a lithographic printing plate comprising the steps of:

information-wise exposing a photographic material comprising (i) a silver halide emulsion layer comprising a silver halide emulsion sensitized to light above 700 nm by means of an infrared sensitizing dye having a maximum absorption between 700 nm and 850 nm, said silver halide emulsion further comprising a red sensitizing dye of the cationic type having a maximum absorption between 600 nm and 700 nm and (ii) a layer containing physical development nuclei, using a light source emitting light above 700 nm and developing a thus obtained information-wise exposed photographic material in the presence of developing agent(s) and silver halide solvent(s).

\* \* \* \* \*